United States Patent [19]

Kamuro

[11] Patent Number: 4,894,705
[45] Date of Patent: Jan. 16, 1990

[54] SEMICONDUCTOR DEVICE

[75] Inventor: Setsufumi Kamuro, Chiba, Japan

[73] Assignee: Sharp Kabushiki Kaisha, Osaka, Japan

[21] Appl. No.: 100,920

[22] Filed: Sep. 24, 1987

[30] Foreign Application Priority Data

Dec. 16, 1986 [JP] Japan ................. 61-300673

[51] Int. Cl.⁴ .............. H01L 23/48; H01L 23/52
[52] U.S. Cl. ............................. 357/71; 357/59; 357/51
[58] Field of Search ................. 357/71, 59, 51

[56] References Cited

U.S. PATENT DOCUMENTS

| 4,297,721 | 10/1981 | McKenny et al. | 357/59 |
| 4,319,261 | 3/1982 | Kub | 357/59 |
| 4,541,006 | 9/1985 | Ariizumi et al. | 357/59 |
| 4,546,366 | 10/1985 | Buchanan | 357/59 |
| 4,604,641 | 8/1986 | Konishi | 357/71 |
| 4,673,969 | 6/1987 | Ariizumi et al. | 357/59 |
| 4,710,897 | 12/1987 | Masuoka et al. | 357/59 |

FOREIGN PATENT DOCUMENTS

| 0010083 | 1/1977 | Japan | 357/59 |
| 0169267 | 10/1982 | Japan | 357/59 |
| 0058752 | 4/1983 | Japan | 357/59 |
| 0008550 | 1/1987 | Japan | 357/59 |

Primary Examiner—Rolf Hille
Assistant Examiner—S. V. Clark
Attorney, Agent, or Firm—Flehr, Hohbach, Test, Albritton & Herbert

[57] ABSTRACT

A semiconductor device has high-resistance polysilicon sections sandwiched between two wiring layers. Low-resistance sections are formed by ion-injection of impurities across selected ones of these high-resistance polysilicon sections to electrically connect the two wiring layers according to a user's specification.

11 Claims, 3 Drawing Sheets

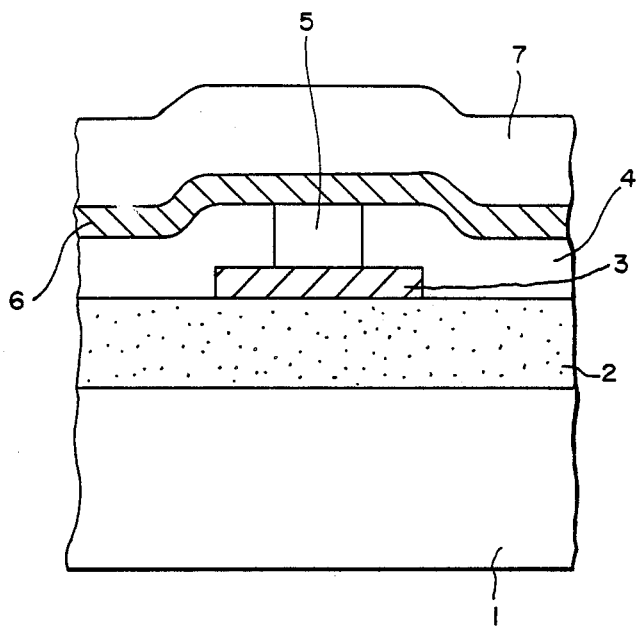
FIG.—1
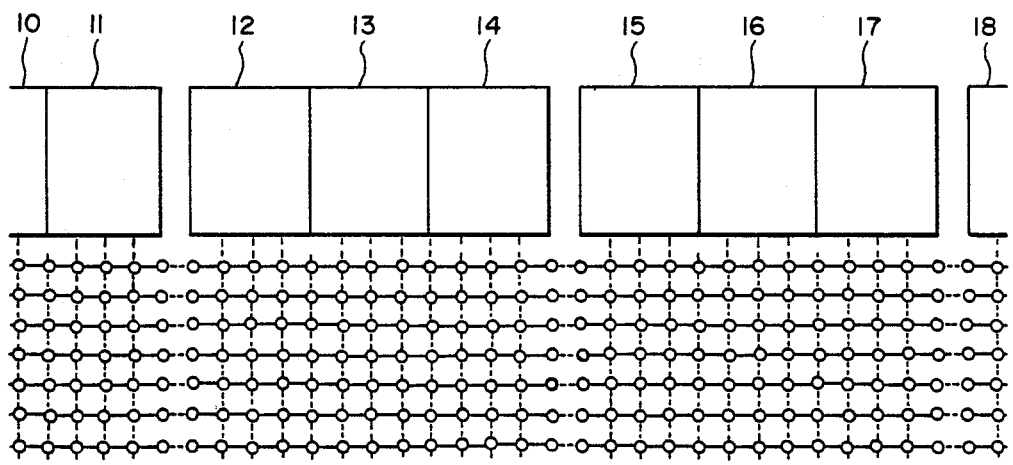
FIG.—3

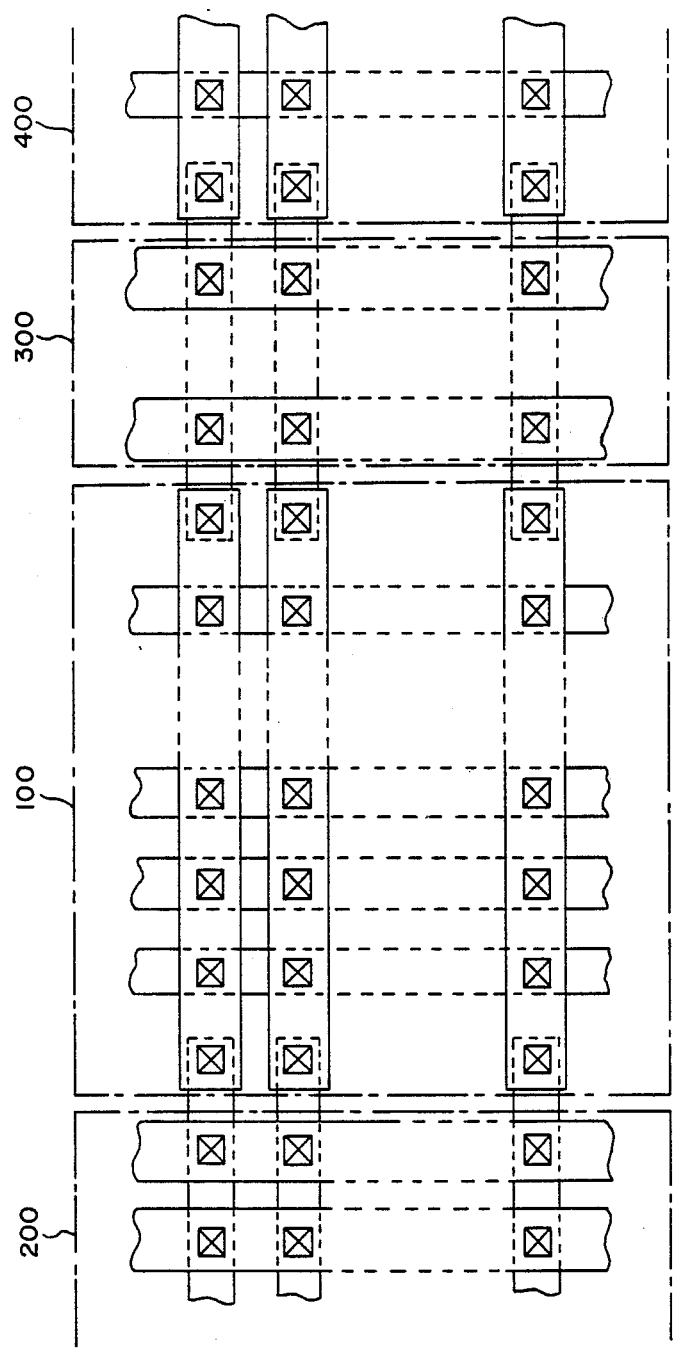
FIG.—4

SEMICONDUCTOR DEVICE

BACKGROUND OF THE INVENTION

This invention relates to a semiconductor device of the type having at least two wiring layers above a semiconductor substrate with upper and lower layers connected to each other at specified positions. More particularly, the present invention relates to a gate array which can be formed according to the functions desired by the user by providing according to the user's specification a first metallic wiring layer, a second metallic wiring layer and contact sections for connecting wire lines of these layers together.

In the field of semiconductor devices, ICs and LSICs according to the user's specifications, or what are commonly referred to as ASIC (application specific IC), are coming to be frequently developed and there seems to be an increasing trend to use them more widely. Two of the important requirements imposed on ASICs are that they can be developed quickly and inexpensively. There is, for example, a method called gate array whereby a large number of transistors are preliminarily arranged in positions and three contact mask sheets (individually for connecting wire lines of the first wiring layer, for connecting wire lines of the second wiring layer and for connecting wire lines of the two layers) are appropriately modified to produce an IC or LSIC having a structure desired by the user. According to the current gate array technology, however, three mask sheets are required for each IC or LSIC, as described above, that is, one each for the metallic wiring layers and another for the contacts (commonly referred to as throughholes), and subsequent processes are additionally required after the steps wherein these mask sheets are used.

SUMMARY OF THE INVENTION

It is therefore an object of the present invention to provide semiconductor devices which can be developed even more quickly and inexpensively than currently possible.

The above and other objects are achieved by the present invention according to which only one mask sheet is used for the production until the last or nearly the last process independently of the user's specification and an IC or LSIC desired by the user is produced by a selective ion injection according to the wiring data of the user's specification. No mask will be required, if a direct electron beam exposure method is adopted.

In other words, the present invention relates to a semiconductor device using metallic wiring in two or more layers and provided with holes in the insulating film between the wiring layers wherever it is required to connect wire lines of the upper and lower layers. These holes are filled with high-resistance polysilicon such that the metallic wiring in the upper layer is electrically insulated from that in the lower layer. The layers are kept in such mutually insulated condition until the last process or nearly the last process. In the final or a nearly final step, doping ions are injected selectively according to the wiring data provided by the user to reduce the resistance of the high-resistance polysilicon between the wire lines of the upper and lower layers such that they become electrically connected.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1 is a schematic sectional view of a semiconductor device embodying the present invention, FIG. 3 is an example of connection between the logical and wiring sections of a semiconductor device of the present invention, and FIG. 4 is another example of layout for the device of FIG. 1.

DETAILED DESCRIPTION OF THE INVENTION

Figure 2:
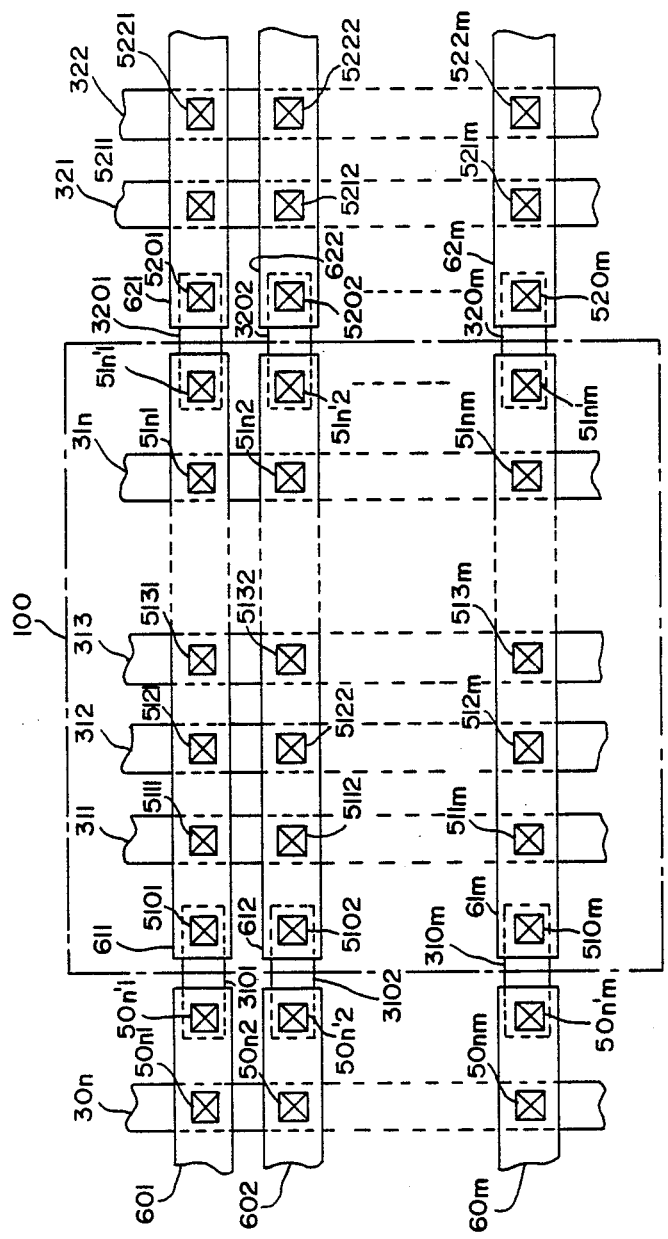
FIG. 2 is an example of layout for the device of FIG. 1.

With reference to FIG. 1 which is a schematic sectional view of a semiconductor device embodying the present invention, numeral 1 indicates a semiconductor substrate, numeral 2 indicates an insulating film such as an oxide, numeral 3 indicates a first metallic wiring layer, numeral 4 indicates an inter-layer insulating film, numeral 5 indicates a polysilicon part, numeral 6 indicates a second metallic wiring layer and numeral 7 indicates a protective film. The first metallic wiring layer 3 comprises aluminum or a metal having a high melting point. If it is aluminum, the polysilicon thereabove is deposited by a low temperature processing method such as plasma chemical vapor deposition or photochemical vapor deposition because aluminum has a low melting point. Thereafter, polysilicon is removed from areas where it is not needed by a method such as reactive ion etching. If the specific resistance of polysilicon is not sufficiently large, impurity ions are injected to increase the resistance as much as possible. If the polysilicon is of P-type, for example, an N-type impurity material such as phosphorus or arsenic is preferably ion-injected to increase its resistance until its specific resistance becomes about 100G$\Omega$/square.

The second metallic wiring layer 6 is formed thereafter and the protective layer 7 is formed on top thereof. Thus, there results a semiconductor device having high-resistance polysilicon filling the area through which it may become necessary to connect the first and second metallic wiring layers. In the condition shown in FIG. 1, however, the two metallic wiring layers are in an electrically insulated relationship with each other.

When a user's specification is provided, impurities such as phosphorus and arsenic are ion-injected at positions in the polysilicon section where the first and second wiring layers should be connected according to the specification, thereby reducing the resistance at such positions. In the case of the example considered above, a large quantity of phosphorus or arsenic is ion-injected to convert the polysilicon section into the N$^+$-type, thereby creating low-resistance areas. It is desirable to reduce the specific resistivity, for example, to about 10$\Omega$/square-100$\Omega$/square.

Since the ion-injection process for this purpose is limited by the capability of the apparatus for ion-injection, etc., however, there may be situations where ion-injection cannot be effected sufficiently through the protective layer 7. In such a situation, the ion-injection process is carried out before the second metallic wiring layer 6 is processed or before the protective layer 7 is formed.

An example of layout is shown in FIG. 2 wherein numerals $30_n$, $31_1$-$31_n$, $32_1$, $32_2$, $31_{01}$-$31_{0m}$, and $32_{01}$-$32_{0m}$ indicate metallic wiring lines in the first layer 3, numerals $60_l$-$60_m$, $61_l$-$61_m$, and $62_l$-$62_m$ indicate metallic wiring lines in the second layer 6 and numerals $50_{nl}$-$50_{nm}$, $51_{1l}$-$51_{lm}$, ..., $51_{nl}51_{nm}$, $52_{1l}$-$52_{lm}$, $52_{2l}$-$52_{2m}$, $50_{n'1}$-$50_{n'm'}$, $51_{0l}$-$51_{0m}$, $51_{n'l}$-$51_{n'm}$, and $52_{0l}$-$52_{0m}$ indicate polysilicon sections filling between the first and second metallic wiring layers 3 and 6. Numeral 100 indicates a block formed by combining parts of the first and second wiring layers 3 and 6. The block 100 is connected with the regions outside through the wiring lines $31_{0l}$-$31_{0m}$, $32_{0l}$-$32_{0m}$, etc. in the first wiring layer 3. As explained above in connection with FIG. 1, the polysilicon section 5 is highly resistive except at the positions where resistance is reduced by ioninjection for establishing electrical connection between the wiring layers 3 and 6. Let us consider, as an example, a situation where it is desired to transmit a signal from the line $31_l$ in the first layer 3 to the line $60_m$ in the second layer 6, to separately connect the lines $31_2$ and $31_n$ in the first wiring layer 3 together and to further connect them together with the line $62_1$ in the second wiring layer 6. This can be accomplished by ion injections at the contact positions $51_{1m}$, $51_{0m}$, $50_{n'm}$, $51_{21}$, $51_{nl}$, $51_{n'l}$ and $52_{01}$ of the polysilicon section 5 to reduce resistance at these positions FIG. 3 shows an example of connection between the portion of a semiconductor device shown in FIG. 2 and logical units 10-18 which may contain basic logical circuits such as inverters and NOR, NAND, OR and AND circuits. The logical units 10-18 may also contain more complicated logical circuits such as latches and flip-flops. The number of input and output lines from the logical units varies, depending on the logic. FIG. 3 represents a situation where logical units comprise 2-input NAND, 2-input NOR and the like such that the user's specification can be satisfied entirely by the wiring connection data but polysilicon parts of the present invention may be provided also within the logical units such that their logical structure can be switched by selective ion-injection of impurities or that only the units to be used are connected to a power source. For simplicity, the metallic lines on the first layer 3 are indicated by broken lines in FIG. 3 and those on the second layer 6 are indicated by solid lines, the polysilicon contact positions being indicated by circles.

The foregoing description of a preferred embodiment of the invention has been presented for purposes of illustration and description. It is not intended to be exhaustive or to limit the invention to the precise form disclosed, and many modifications and variations are possible in light of the above teaching For example, although FIG. 2 showed a situation wherein the block 100 is connected with neighboring blocks through the lines $31_{0l}$-$31_{0m}$ and $32_{01}$-$32_{0m}$ in the first layer 3, the block 100 can be connected with its neighboring blocks 200 and 300 on the opposite sides as shown in FIG. 4 by reversing the structures of the first and second wiring layers 3 and 6 such that the polysilicon sections required for such inter-block connections can be reduced. Moreover, it is not necessary that blocks of similar structure alone be used for wiring. There is no reason to prevent the use of blocks having different structures.

In summary, a semiconductor device of the present invention is characterized not only as having at least two wiring layers above a semiconductor substrate but also as having a high-resistance polysilicon section sandwiched therebetween through which impurities are ion-injected to selectively form low-resistance areas to establish electrical connections of the lines on different layers. If this method is applied to a gate array, for example, a new device can be developed quickly and inexpensively. Any modifications and variations on the disclosures given above which may be apparent to a person skilled in the art are intended to be included within the scope of this invention.

What is claimed is:

1. A semiconductor device comprising
a first wiring layer,
a second wiring layer,
an inter-layer insulative film between said first wiring layer and said second wiring layer, and
a plurality of polysilicon sections sandwiched between said first and second wiring layers, different ones of said polysilicon sections being separated by said inter-layer insulative film, selected ones of said polysilicon sections being low-resistance polysilicon sections and the rest of said polysilicon sections being high-resistance polysilicon sections such that said first and second wiring layers are electrically connected with each other through each of said low-resistance polysilicon sections.

2. The semiconductor device of claim 1 wherein said low-resistance polysilicon sections contain impurities.

3. The semiconductor device of claim 1 further comprising a semiconductor substrate and an insulating layer between said semiconductor substrate and said second wiring layer.

4. The semiconductor device of claim 1 wherein said second wiring layer comprises aluminum.

5. The semiconductor device of claim 1 wherein said second wiring layer comprises a metal with a high melting point.

6. The semiconductor device of claim 1 wherein said high-resistance polysilicon sections have a specific resistance of about $100\Omega$/square.

7. The semiconductor device of claim 1 wherein said high-resistance polysilicon sections are of P-type and include N-type impurities.

8. The semiconductor device of claim 1 wherein said low-resistance polysilicon sections have specific resistance in the range of $10$-$100 G\Omega$/square.

9. The semiconductor device of claim 1 further comprising a protective layer covering said first wiring layer.

10. The semiconductor device of claim 1 wherein said first and second wiring layers each comprise a plurality of mutually parallel metallic lines.

11. The semiconductor device of claim 3 wherein said low-resistance polysilicon sections are of $N^{30}$-type.

* * * * *

UNITED STATES PATENT AND TRADEMARK OFFICE
CERTIFICATE OF CORRECTION

PATENT NO.  : 4,894,705
DATED       : January 16, 1990
INVENTOR(S) : Setsufumi Kamuro It is certified that error appears in the above—identified patent and that said Letters Patent is hereby corrected as shown below:

<u>IN THE CLAIMS</u>:

Claim 8, line 3, change "10-100GΩ/square" to --10-100Ω/square--.

Signed and Sealed this

Eighteenth Day of December, 1990

*Attest:*

HARRY F. MANBECK, JR.

*Attesting Officer*  *Commissioner of Patents and Trademarks*